United States Patent [19]

Rohner

[11] Patent Number: 5,861,632

[45] Date of Patent: Jan. 19, 1999

[54] METHOD FOR MONITORING THE PERFORMANCE OF AN ION IMPLANTER USING REUSABLE WAFERS

[75] Inventor: Don R. Rohner, Austin, Tex.

[73] Assignee: Advanced Micro Devices, Inc.

[21] Appl. No.: 906,326

[22] Filed: Aug. 5, 1997

[51] Int. Cl.$^6$ .................................................. H01J 37/317
[52] U.S. Cl. ....................................................... 250/492.21
[58] Field of Search ............................ 250/492.21; 438/5

[56] References Cited

U.S. PATENT DOCUMENTS

| | | | |
|---|---|---|---|
| 4,385,634 | 5/1983 | Bowen | 128/653 |
| 4,579,463 | 4/1986 | Rosencwaig et al. | 374/57 |
| 4,799,392 | 1/1989 | Wilson et al. | 250/492.21 |
| 5,185,273 | 2/1993 | Jasper | 250/492.21 |
| 5,206,710 | 4/1993 | Geiler et al. | 356/432 |

*Primary Examiner*—Jack I. Berman
*Attorney, Agent, or Firm*—Kevin L. Daffer; Conley, Rose & Tayon

[57] ABSTRACT

Low-mass implants, for example hydrogen and helium ions, are used in place of more typical dopants like boron, phosphorus, and arsenic for testing the performance of ion implanters. Consistency between ion implantation test runs with the low-mass ions may be used to provide information about the proper operation of ion implanters. Lower-mass ions do not transfer as much of their energy to the wafer as heavier ions. Consequently, high energy ion implantations with low-mass ions do not repair wafer surface damage to the same degree as ion implantations with high-mass ions. When sufficient surface damage exists, a thermawave tool can detect the damage and provide information about the performance of the ion implanter. This determination can be made in a one-step method. An additional advantage to implanting the test wafers with low-mass ions is being able to reuse the wafers for subsequent test runs. When low-mass implants are used (such as hydrogen and helium), a thermal anneal subsequent to the ion implantation can repair any damage to the crystal and at the same time dissociate the low-mass dopants from the silicon crystal. The crystal is returned in its original condition after the escape of the low-mass dopants. If reusability is the highest priority, silicon ions may be used as the test species. Implanted silicon ions can cause measurable damage to the surface of the wafer. A calibration state of the ion implanter may then be determined by examining the surface damage. A subsequent thermal anneal can repair the damage to the surface and return the crystal to its original state.

16 Claims, 6 Drawing Sheets

METHOD FOR MONITORING THE PERFORMANCE OF AN ION IMPLANTER USING REUSABLE WAFERS

BACKGROUND OF THE INVENTION

1. Field of the Invention

This invention relates to the field of semiconductor processing and, more particularly, to a method and apparatus that monitor the performance of an ion implanter to ensure its calibration.

2. Description of Relevant Art

Fabrication of a metal-oxide-semiconductor ("MOS") transistor is well-known. Fabrication typically begins by lightly doping a single-crystal silicon substrate n-type or p-type. The specific area where the transistor will be formed is then isolated from other areas on the substrate using various isolation structures. A gate dielectric is then typically formed by oxidizing the silicon substrate. A gate conductor is then patterned using a photolithography mask from a layer of polycrystalline silicon ("polysilicon") deposited upon the gate dielectric. The polysilicon is rendered conductive with the introduction of ions from an implanter or a diffusion furnace. Subsequently, source and drain regions are doped with a high-dose n-type or p-type dopant. If the source and drain regions are doped n-type, the transistor is referred to as NMOS, and if the source and drain regions are doped p-type, the transistor is referred to as PMOS. A channel region between the source and the drain is protected from the implant species by the pre-existing gate conductor. When voltage above a certain threshold is applied to the gate of an enhancement-mode transistor, the channel between the source and drain becomes conductive and the transistor turns on.

The amount of dopants introduced into the source and drain regions and the polysilicon gate conductor of a transistor are critical to the performance of the device. Chemical diffusion is one method currently used to introduce dopants into semiconductors. Diffusion is the process by which a species moves as a result of the presence of a chemical barrier. A typical diffusion system consists of a heating element, diffusion tube, and dopant delivery system. The dopant sources can be gaseous (the most common), liquid (bubbler or spin-on), or solid (tablet, powder, or disk). Many wafers can be doped at the same time using chemical diffusion. However, chemical diffusion does not have good control over the amount of dopants introduced into the wafers and the location of where the dopants are introduced.

During the past 25 years, ion implantation has become the preferred technology for introducing dopants into target materials used in semiconductor processing. Ion implantation is a process in which energetic, charged atoms or molecules are accelerated by an ion implanter and then directed toward the semiconductor substrate. Acceleration energies can range from 10 keV to several MeV for high-energy implant systems.

FIG. 1 shows a schematic of an ion implanter. Ion source 10 ionizes the species to be implanted to form a plasma at low pressure, typically $10^{-3}$ torr. A voltage difference in the range of 15–40 kV is then applied between ion source 10 and plates 12 to extract and accelerate the ions which now form beam 14. Beam 14 is subsequently routed through analyzing device 16, typically a magnet, which spatially separates the beam according to the ionic mass of its constituents. The analyzer directs only ions with a specific mass toward the target while impurities with different ionic masses are disposed elsewhere.

Acceleration tube 18 creates an acceleration field to further increase the ion energy to the desired energy level. Tube 18 may also be used to decelerate the ions if the desired implantation energy is less than the extracted energy. Focusing ring 20 is used to focus the beam into a ribbon or round shape depending on the application. Plates 22 separate out any neutral components of the beam. As a result, neutral beam 24 is unaffected by plates 22 and is separated from ion beam 26 which is bent toward wafer target 28. Neutral beam 24 is stopped by target 30.

Scanner plates 32 (x-axis) and 34 (y-axis) are responsible for controlling the position of the ion beam over the surface of the wafer. By applying the appropriate timing control sequence to the plates, the whole wafer may be scanned by the ion beam. The timing control sequence applied to the plates is such to ensure a uniform dopant distribution across the entire surface of the wafer.

Ion implantation has the ability to precisely control the number of implanted dopant atoms into substrates to within 3%. For dopant control in the $10^{14}$–$10^{18}$ atoms/cm$^3$ range, ion implantation is clearly superior to chemical diffusion techniques. Mass separation by the ion implanter ensures a very pure dopant. Ion implantation is used throughout the semiconductor manufacturing process. Low dose ($10^{11}$–$10^{12}$ ions/cm$^3$) ion implantation can be used to adjust the threshold voltage of transistors by implanting the channel region to change its doping concentration. Ions can be introduced into the semiconductor substrate to create the source and drain regions of transistors. The polysilicon gate structure of a transistor may also be doped to become conductive at the same time the source and the drain are doped. Ion implants can be used to increase the threshold voltage of parasitic transistors in order to minimize the probability of a turn-on of such a transistor.

Heavy doping with an ion implanter can be used to alter the etch characteristics of materials for patterning. The implantation may be performed through materials that may already be in place while other materials may be used as masks to create specific doping profiles. Furthermore, more than one type of dopants may be implanted at the same time and at the same position on the wafer. Other advantages include the fact that ion implantation may be performed at low temperature which does not harm photoresist and in high vacuum which provides a clean environment.

It is important to monitor the performance of the ion implanter to ensure that the correct amount of dose is implanted into each wafer and that the implanter remains calibrated between ion implantations. In many instances, monitor and test wafers are exposed to the implanter prior to exposing actual product wafers. These test wafers are either void of device structures or have arrays of test structures designed for measuring, the parameters of interest.

The four-point sheet resistance method is the most commonly used technique for measuring implantation dosages because of its versatility. A rapid thermal anneal ("RTA") step must first follow the ion implantation step in order to diffuse and activate the implanted ions. In addition, the RTA step repairs any damage to the crystal structure that occurred during the ion implantation step. An RTA process is typically performed at 420°–1150° C. and lasts anywhere from a few seconds to a few minutes. Large area incoherent energy sources ensure uniform heating of the wafers to avoid warpage. Various heat sources are utilized, including arc lamps, tungsten-halogen lamps, and resistively-heated slotted graphite sheets. Most heating is performed in inert atmospheres (argon or nitrogen) or vacuum, although oxygen or ammonia for growth of silicon dioxide and silicon nitride may be introduced into the RTA chamber. The resistance measurements using four co-linear probes follow the thermal anneal. Current is introduced by the two outer probes while the two inner probes measure the voltage drop. Doses ranging from $10^{11}$–$10^{16}$ ions/cm$^2$ can be measured using the four-point sheet resistance method.

The four-point sheet resistance method is relatively time consuming since it involves a two-step process (annealing and measuring resistance), which can reduce the overall wafer throughput. Furthermore, the intermediate anneal step is an additional variable in the process of determining the consistency and calibration of the ion implanter. A more reliable, one-step method for examining the performance of an ion implanter is the thermawave method. A thermawave measures the damage that the implant causes to the upper surface of the wafer. An argon pump laser is directed toward the surface of the wafer to generate a thermal and electron-hole plasma waves. A HeNe probe laser measures the change in reflectivity induced by the argon laser at a second position on the surface of the wafer. The reflectivity is indicative of the damage on the surface due to the ion implantation.

Typical surface damage on a wafer is shown in FIG. 2. Wafer 40 is implanted with ions 42 to form doped region 44 near the upper surface of wafer 40. Expanded view 46 shows a detailed view of the arrangement of atoms close to the surface. Silicon atoms are shown by hollow circles (o) and dopant atoms by solid circles (•). Silicon atoms are shown displaced, and in some cases replaced, by dopant atoms. Dopant atoms are either in places of silicon atoms or in between them.

As the implantation energy increases, the additional energy provided begins to repair the surface damage. As a result, for high energy implants, the damage to the wafer surface is not enough to be measured by the thermawave method. FIG. 3 shows the resulting damage to a wafer surface from a high energy implant. Wafer 50 is implanted with high energy ions 52 to form doped region 54 near the upper surface. Expanded view 56 shows a detailed view of the arrangement of atoms close to the surface. Most of the damage caused by the high energy ions is repaired due to additional energy provided to the wafer.

Independent of the method used to monitor the implantation dosage, the test wafers are not reusable. After the first implantation, a new set of wafers must be used. Replacing the test wafers after every set of measurements can be very costly.

It would be desirable to have a one-step method to monitor the performance of the ion implanter. A one-step method introduces no additional variables that could affect the implanted ions and thus provides a more accurate information on the performance of the ion implanter. It would also be desirable to have a one-step method which can monitor the performance of the ion implanter for low, medium, and high implantation energies. It would additionally be desirable to be able to reuse test wafers for more than just one ion implanter test.

SUMMARY OF THE INVENTION

Calibration of the ion implanter may accomplished with test species other than the ones typically used for the ion implantation of product wafers. Low mass ions, for example hydrogen and helium ions, may be used in place of more typical dopants like boron, phosphorus, and arsenic for testing the performance of the ion implanter. The amount of energy gained by an ion in an accelerating potential depends only on the ion's charge and is independent of the ion's mass. Consistency between test ion implantations with the low mass ions may be used to provide information about the proper operation of the ion implanter.

Lower-mass ions do not transfer as much of their energy to the wafer as heavier ions. Consequently, high energy ion implantations with low-mass ions do not repair wafer surface damage to the same degree as ion implantations with high-mass ions. When sufficient surface damage exists, a thermawave tool can detect the surface damage and provide information about the performance of the ion implanter. This determination can be made in a one-step process.

An additional advantage to implanting the test wafers with low-mass ions is being able to reuse the wafers for subsequent test runs. Typically, the test wafers are discarded after every test run since the doping process is irreversible. However, when low-mass implants are used (such as hydrogen and helium), a thermal anneal subsequent to the ion implantation can repair any damage to the crystal and at the same time dissociate the low-mass dopants from the silicon crystal. The crystal is returned to its original electrical/damage-free condition, after the escape of the low-mass dopants. (A pre-measurement may be necessary prior to the damage implant to assure accuracy.)

If reusability and measurement of low dose is the highest priority, silicon or argon ions may be used as the test species. Implanted silicon or argon ions, like other ions, can cause measurable damage to the surface of the wafer. A thermawave tool may then be used to determine the calibration state of the ion implanter by measuring that damage. A subsequent thermal anneal can repair the damage to the surface by perfectly incorporating the silicon in the lattice structure or in the case of argon causing it to escape into the atmosphere. The crystal is then returned to its original state for multiple reuses of the wafer.

Broadly speaking, the present invention contemplates a method for calibrating an ion implanter. A reusable test semiconductor wafer is provided. The ion implanter is supplied with a test species that is dissimilar to a species used by the implanter to implant a product semiconductor wafer. The test species is then implanted into the test wafer. A dose of the test species is measured with a metrology tool using a one-step process. The calibration state of the ion implanter is determined by comparing the dose of the implant with a previously recorded dose.

The semiconductor wafer preferably comprises single-crystalline silicon. The test species may comprise an ion with atomic weight less than approximately 10. In an alternative embodiment, the test species may comprise silicon or argon ions. Typical species used by the ion implanter to implant a product wafer include boron, phosphorus, or arsenic.

The implantation of the test species may be performed at a low, medium, or high energies. The implantation of the test species causes measurable wafer surface damage for low, medium, and high energies. The dose of the test species may be measured with a one-step thermawave method. The one-step thermawave method comprises first directing an argon pump laser at a first point on a surface of the wafer to generate a thermal and an electron-hole plasma wave. The change in reflectivity of the surface induced by the argon pump laser is then measured at a second point on the surface using a HeNe probe laser. The second point is a spaced distance from the first point. The surface damage is determined using the changes in the reflectivity of the surface.

There are low mass ions that can be used to check the calibration of high-dose implanters and medium mass ions that can check the calibration of low to medium mass ions that can check the calibration of low to medium-dose implanters. In either case, the wafers can be post-annealed and re-used.

BRIEF DESCRIPTION OF THE DRAWINGS

Other objects and advantages of the invention will become apparent upon reading the following detailed description and upon reference to the accompanying drawings in which.

Figure 1:
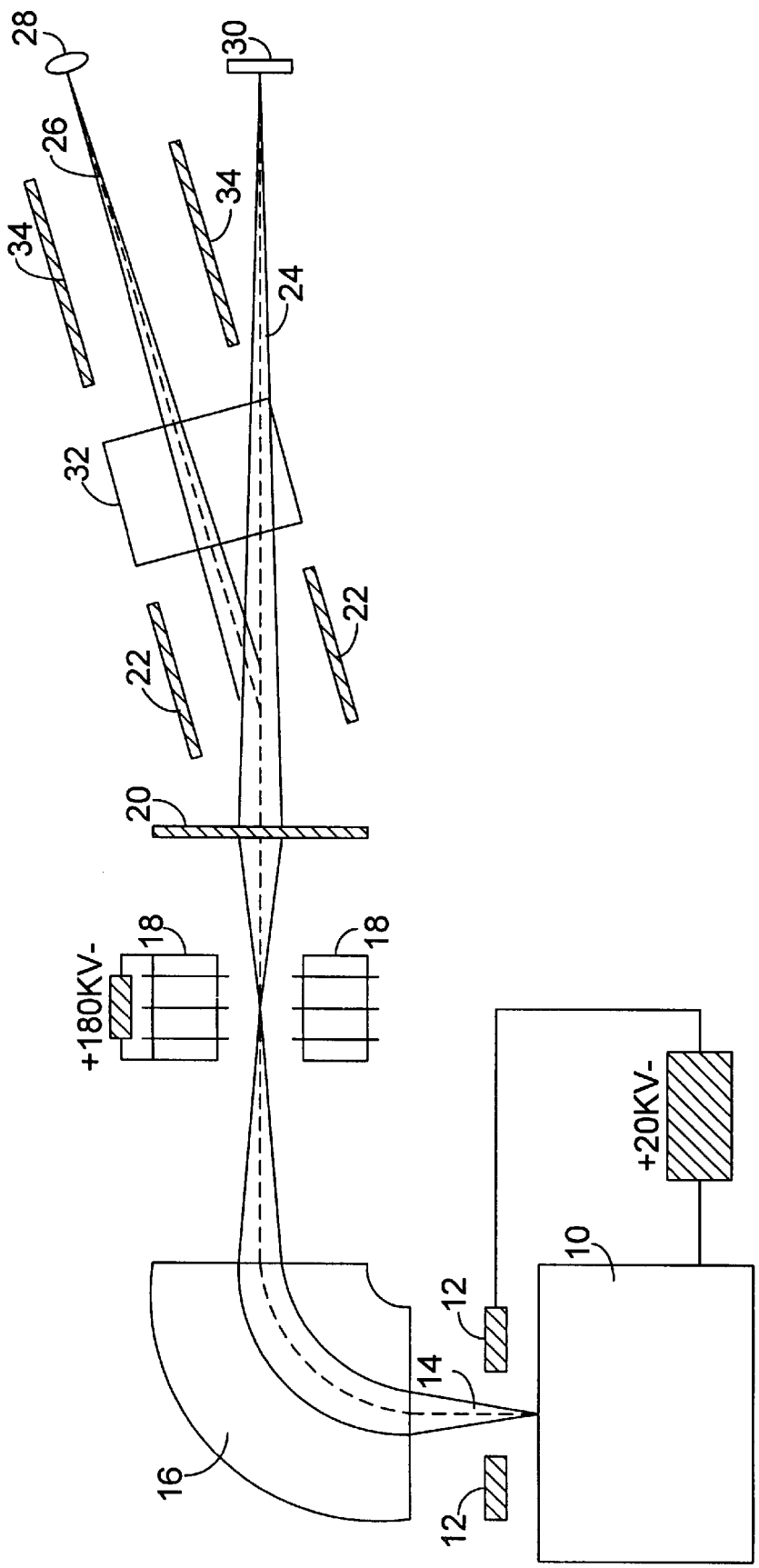
FIG. 1 is a schematic of an ion implanter, a device used to introduce high-energy, charged dopant ions into a wafer topography.
Figures 2A, 2B:
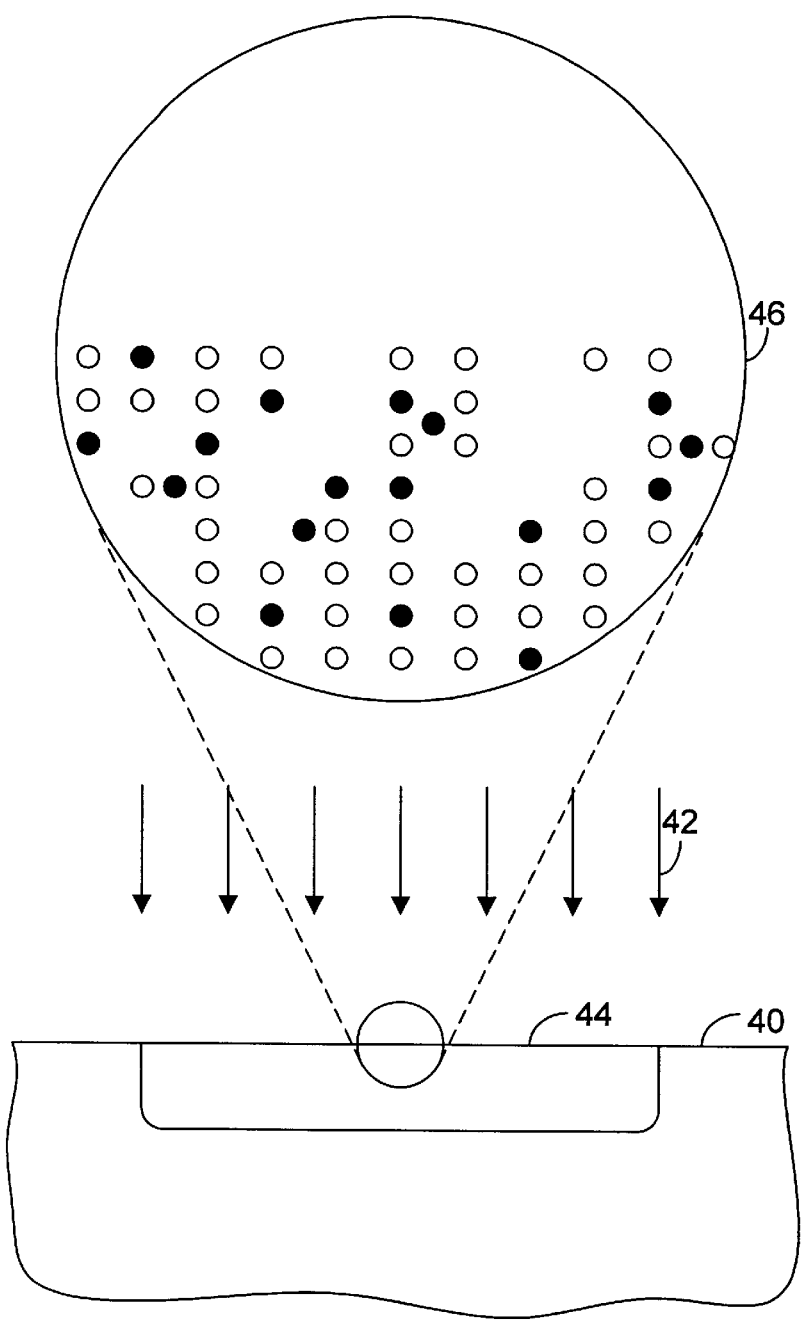
FIG. 2 shows a cross-sectional view of a semiconductor substrate with an additional expanded view of a portion of the upper surface of the substrate showing typical damage to the upper surface caused by an ion implant.
Figures 3A, 3B:
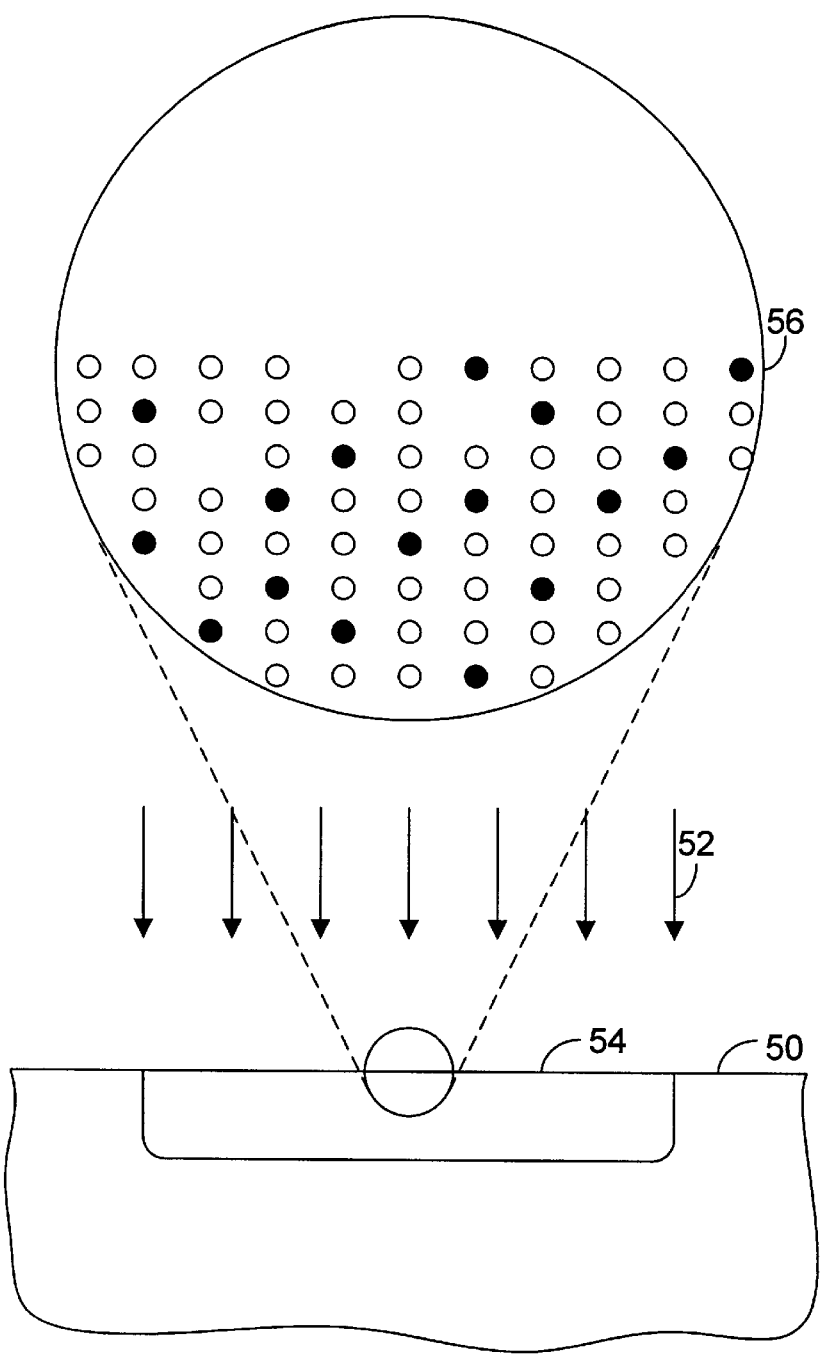
FIG. 3 shows a cross-sectional view of a semiconductor substrate with an additional expanded view of a portion of the upper surface of the substrate showing damage to the upper surface caused by a high-energy ion implant.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 4:
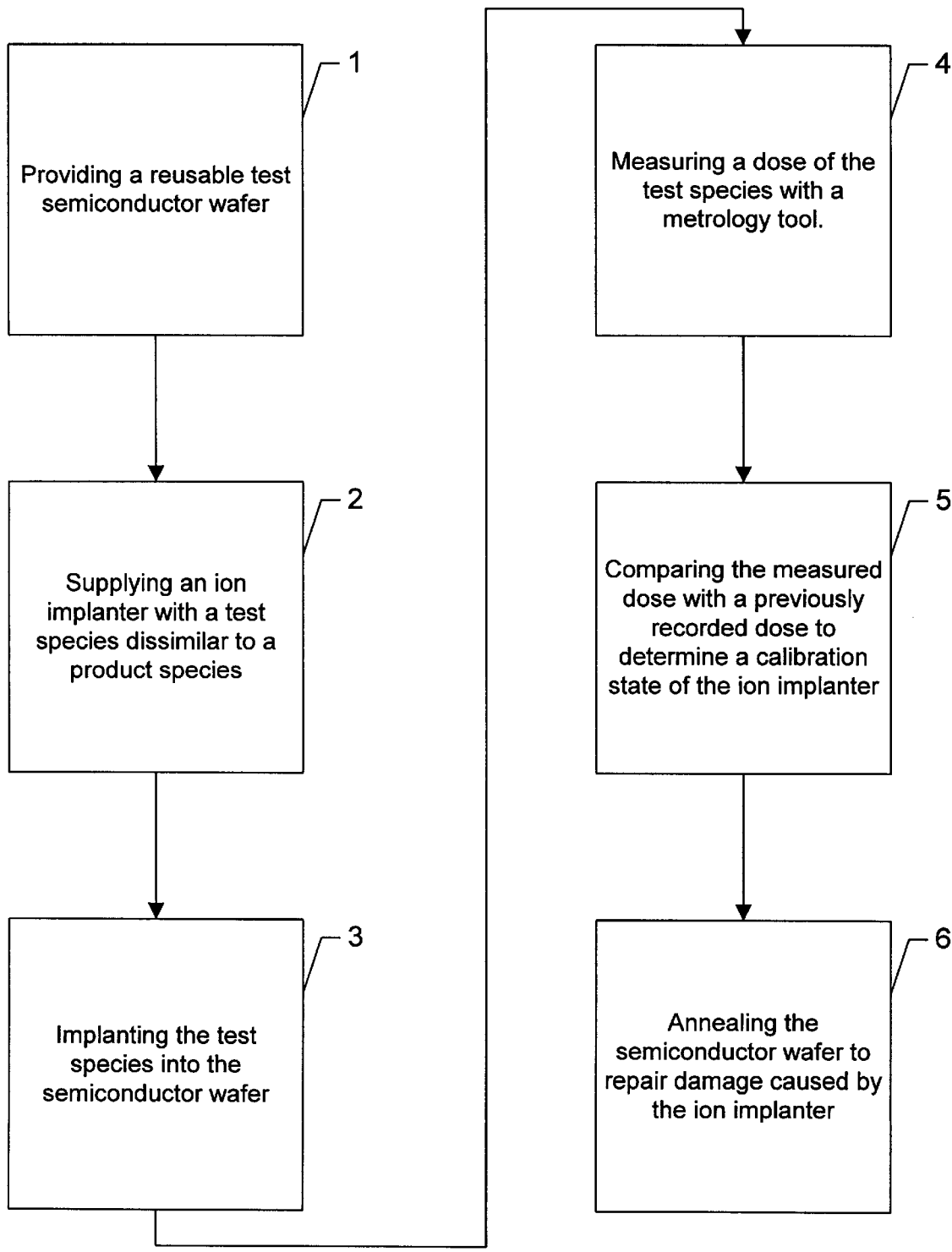
FIG. 4 shows a flowchart describing the method for calibrating an ion implanter using reusable test wafers.

Turning now to the figures, FIG. 4 shows a flowchart describing the method for calibrating an ion implanter using reusable test wafers. Referring to Step 1 of the flowchart of FIG. 4, a semiconductor wafer is first provided. The semiconductor wafer preferably comprises an epitaxial layer of single-crystalline silicon. The performance of ion implanters is typically monitored with test wafers. Test wafers are periodically implanted by the ion implanter to ensure that the ion implanter is correctly calibrated.

Referring now to Step 2 of the flowchart of FIG. 4, an ion implanter is supplied with a test species which is dissimilar to a product species. The test implants can be performed on the test wafers with species other than the species used for the implantation of product wafers. Dopants used for the implantation of product wafers may be boron for p-type doping and phosphorus and arsenic for n-type doping. In a preferred embodiment, species with a very small ionic mass may be used when implanting test wafers in place of the species used for implanting product wafers. Since test wafers are only used to determine the proper operation of ion implanters and not for the manufacturing of devices, different species may be used if the different species can provide adequate information for the calibration of the ion implanter. Examples of such species are hydrogen and helium. In an alternative embodiment, silicon ions may be used for the calibration of an ion implanter. Similarly, silicon can cause measurable surface damage that can be measured by the appropriate metrology tool. Damage caused by the silicon can be easily repaired by annealing the silicon.

Figures 5A, 5B:
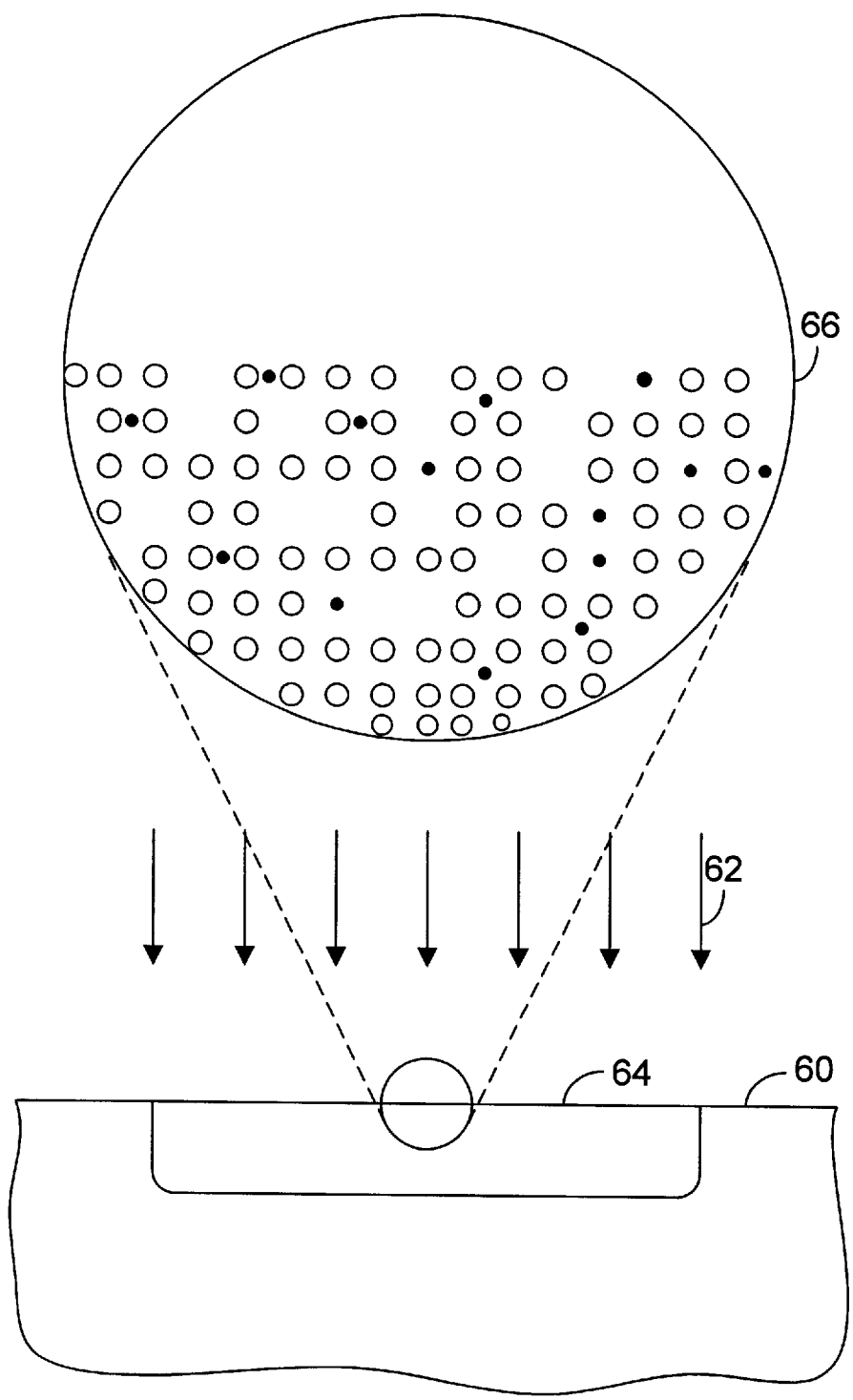
FIG. 5 shows a cross-sectional view of a semiconductor substrate with an additional expanded view of a portion of the upper surface of the substrate showing damage to the upper surface caused by a high-energy, low-mass ion implant.

Referring now to Step 3 of the flowchart of FIG. 4, the alternative test species are implanted into the semiconductor wafer. Low-mass test species do not transfer as much of their energy to the wafer as heavier ions. As a result, high energy ion implantations with low-mass ions do not repair wafer surface damage to the same degree as ion implantations performed with heavier ions. Turning now to FIG. 5, damage to the surface of a wafer caused by high-energy, low-mass ions is shown. Wafer 60 is implanted with low-mass, high-energy ions 62. The implanted ions create doped area 64 which is proximal to the upper surface of the wafer surface. Significant damage to the upper surface of the wafer can be seen from expanded view 66 of a portion of the upper surface of the wafer. The silicon atoms are represented by circles (o) while the high-energy, low-mass implanted ions are represented by small solid dots (•).

Referring now to Step 4 of the flowchart of FIG. 4, a dose of the implanted species is measured by detecting surface damage using the appropriate metrology tool. When sufficient damage to the wafer surface exists, a thermawave tool may be used to detect the damage to the surface of the wafer. Information about the performance of the ion implanter may then be obtained by examining the readings of the thermawave. When high-energy, high-mass ions are used to implant the test wafers, most of the damage to the silicon is repaired by the transfer of energy to wafer. Having sufficient surface damage due to the implant and being able to use the thermawave tool, eliminates the two-step method of annealing the wafer and then measuring the sheet resistance along the surface of the wafer to obtain information about the implant.

Referring now to Step 5 of the flowchart of FIG. 4, a measured dose of the implanted species is compared with a previously recorded dose to determine the calibration state of the ion implanter. Consistency between test ion implantations with the low mass ions may be used to provide information about the proper operation of the ion implanter. The amount of energy acquired by the ions from the acceleration potential of the ion implanter is independent of the mass of the ions. The energy of the ions only depends on the ionic charge and the applied acceleration potential. Therefore, we expect the low mass ions to acquire the same amount of energy as the higher mass ions for the same settings of the ion implanter.

Figure 6:
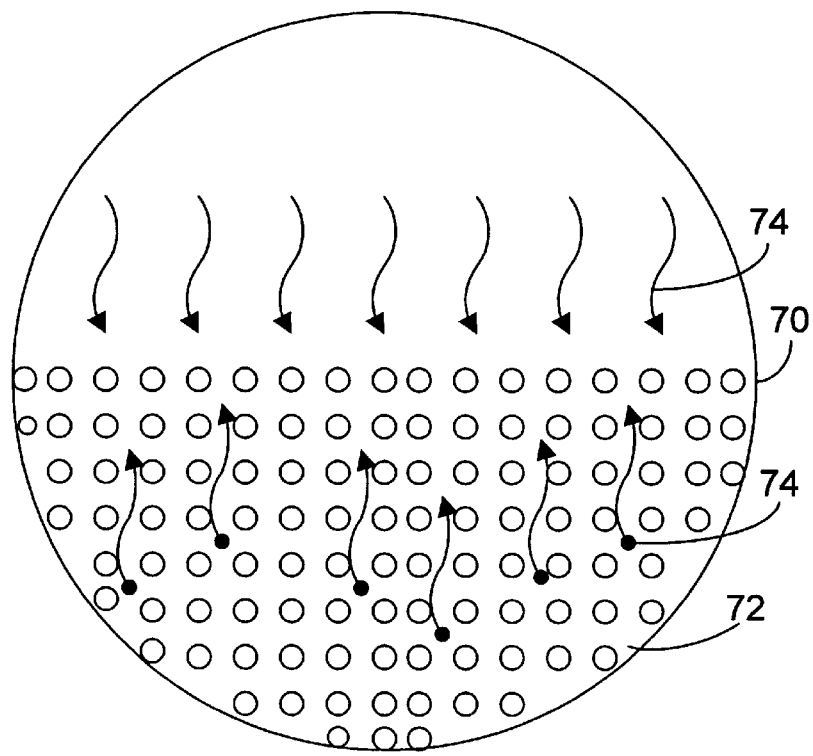
FIG. 6 shows a cross-sectional, expanded view of a portion of the upper surface of a semiconductor substrate showing escape of low-mass dopants from the upper surface caused by a thermal anneal.

Referring now to Step 6 of the flowchart of FIG. 4, the semiconductor wafer is annealed to repair damage caused by the ion implanter. Typically, the test wafers are discarded after each test run since the doping process is irreversible. However, when low-mass. implants are used (such as hydrogen and helium), a thermal anneal subsequent to the ion implantation can repair any damage to the crystal structure and at the same time dissociate the low-mass dopants from the silicon atoms. This enables the wafers to be reused multiple times which provides considerable savings. Turning now to FIG. 6, expanded view 70 of the upper surface of silicon wafer 72 is shown. The upper surface of silicon wafer 72 has been implanted with low-mass ions 74. Thermal anneal 74 is then applied to wafer 72 that causes low-mass ions 74 to dissociate from the silicon atoms (shown here by the circles "o") and then escape from the crystal. The test wafer may now be reused for subsequent testing of the ion implanter.

Figure 7:
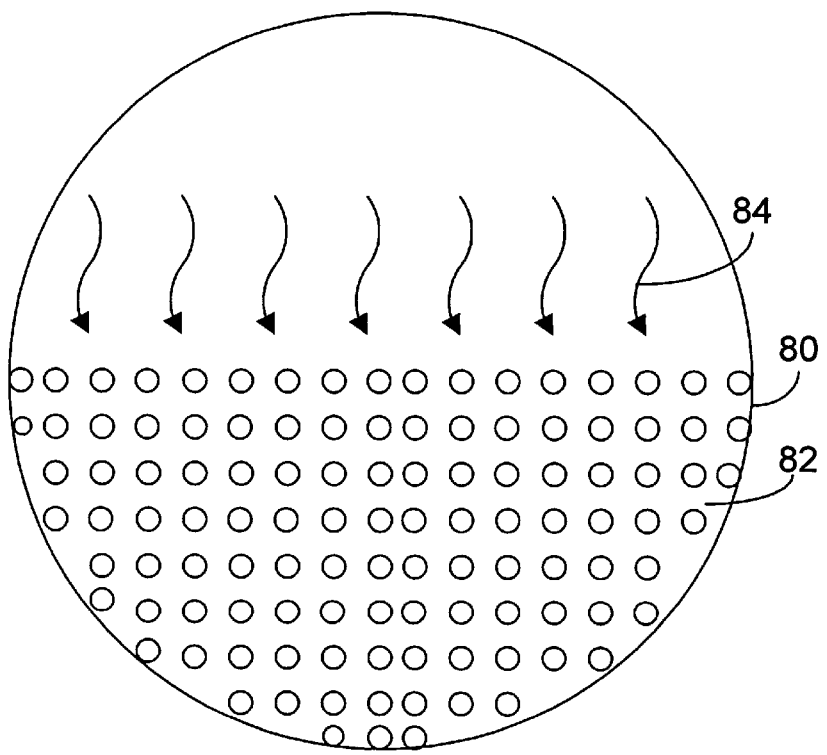
FIG. 7 shows a cross-sectional, expanded view of a portion of the upper surface of a semiconductor substrate showing repair to the upper surface with a thermal anneal after an ion implantation with silicon ions.

Turning now to FIG. 7, an alternative embodiment of the invention is shown where silicon ions may be used as the test species of the ion implanter. Similarly to other species, ion implantation with silicon ions causes sufficient damage to the surface of the wafer. The damage may then be detected with a thermawave tool to determine information about the performance of the ion implanter. Expanded view 80 of the upper surface of silicon wafer 82 is shown. The upper surface of silicon wafer has been implanted with silicon ions. Thermal anneal 84 is then applied to the wafer to totally repair the crystal structure.

It will be appreciated to those skilled in the art having the benefit of this disclosure that this invention is believed to be capable of compensating for spatial variations in electrical, physical, and chemical properties of semiconductor wafers. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A method for calibrating an ion implanter by comparing a measured dose with a previously recorded dose, said method comprising:

providing a reusable test semiconductor wafer;

supplying said ion implanter with a test species, wherein said test species is dissimilar to a product species used by said ion implanter to implant a product semiconductor wafer;

implanting said test species into said test wafer, wherein machine settings of said ion implanter are the same as machine settings of ion implanter in a previous test run;

measuring said measured dose of said test species with a metrology tool;

comparing said dose of said implant with said previously recorded dose to determine a calibration state of said implanter; and annealing said semiconductor wafer to repair damage caused by said ion implanter.

2. The method as recited in claim 1, wherein said semiconductor wafer comprises an epitaxial layer of single-crystalline silicon.

3. The method as recited in claim 1, wherein said test species is selected from the group consisting of hydrogen, helium, and silicon.

4. The method as recited in claim 1, wherein said species used by said implanter to implant said product semiconductor wafer comprises boron, phosphorus, or arsenic.

5. The method as recited in claim 1, wherein said step of implanting said test species comprises implanting said species at high energies above approximately 100 keV.

6. The method as recited in claim 5, wherein said test species are chosen from the group consisting of helium and hydrogen.

7. The method as recited in claim 1, wherein said step of implanting said test species comprises causing measurable wafer surface damage for said high energies.

8. The method as recited in claim 1, wherein said high energies are energies above approximately 100 keV.

9. The method as recited in claim 1, wherein the step of measuring a dose of said test species comprises using a one-step thermawave method.

10. The method as recited in claim 9, wherein the step of using a one-step thermawave method comprises:

directing an argon pump laser at a first point on a surface of said wafer to generate a thermal wave and an electron-hole plasma wave;

measuring the change in a reflectivity of said surface induced by said argon pump laser at a second point on said surface using a HeNe probe laser, wherein said second point is a spaced distance from said first point; and determining a damage of said surface using changes in said reflectivity of said surface.

11. A method for calibrating an ion implanter by comparing a measured dose with a previously recorded dose, said method comprising:

providing a reusable test semiconductor wafer, wherein said semiconductor wafer comprises an epitaxial layer of single-crystalline silicon;

supplying said ion implanter with a test species, wherein said test species is dissimilar to a product species used by said ion implanter to implant a product semiconductor wafer and wherein said test species is selected from the group consisting of hydrogen, helium, and silicon;

implanting said test species into said test wafer, wherein machine settings of said ion implanter are the same as machine settings of ion implanter in a previous test run;

measuring said measured dose of said test species with a thermawave tool, wherein said thermawave tool measures damage to a surface of said semiconductor wafer;

comparing said dose of said implant with said previously recorded dose to determine a calibration state of said implanter; and annealing said semiconductor wafer to repair surface damage caused by said ion implanter.

12. The method as recited in claim 11, wherein said species used by said implanter to implant said product semiconductor wafer comprises boron, phosphorus, or arsenic.

13. The method as recited in claim 11, wherein said step of implanting said test species comprises implanting said species at high energies above approximately 100 keV.

14. The method as recited in claim 13, wherein said step of implanting said test species comprises causing measurable wafer surface damage for said high energies.

15. The method as recited in claim 11, wherein the step of measuring a dose of said test species comprises using a one-step thermawave method.

16. The method as recited in claim 11, wherein the step of using a one-step thermawave method comprises:

directing an argon pump laser at a first point on a surface of said wafer to generate a thermal wave and an electron-hole plasma wave;

measuring the change in a reflectivity of said surface induced by said argon pump laser at a second point on said surface using a HeNe probe laser, wherein said second point is a spaced distance from said first point; and determining a damage of said surface using changes in said reflectivity of said surface.

* * * * *